United States Patent [19]

Zhang et al.

[11] Patent Number: 5,808,331

[45] Date of Patent: Sep. 15, 1998

[54] MONOLITHIC SEMICONDUCTOR DEVICE HAVING A MICROSTRUCTURE AND A TRANSISTOR

[75] Inventors: Zuoying L. Zhang, Gilbert; Barun K. Kar, Tempe; Guang X. Li, Gilbert; Ronald J. Gutteridge, Paradise Valley; Eric D. Joseph, Chandler, all of Ariz.

[73] Assignee: Motorola, Inc., Schaumburg, Ill.

[21] Appl. No.: 895,171

[22] Filed: Jul. 16, 1997

Related U.S. Application Data

[63] Continuation of Ser. No. 523,418, Sep. 5, 1995, abandoned.

[51] Int. Cl.$^6$ .................................................... H01L 29/82
[52] U.S. Cl. .......................... 257/254; 257/415; 257/417; 257/420; 73/514.21; 73/514.22; 73/514.36
[58] Field of Search ................................. 257/254, 417, 257/418, 419, 420, 415; 73/514.21, 514.22, 514.36, 514.37, 514.24, 514.38, DIG. 1

[56] References Cited

U.S. PATENT DOCUMENTS

| 4,378,510 | 3/1983 | Bennett | 310/329 |
|---|---|---|---|
| 4,873,871 | 10/1989 | Bai et al. | 73/777 |
| 5,126,812 | 6/1992 | Greiff | 257/420 X |
| 5,313,836 | 5/1994 | Fujii et al. | 73/514.36 X |
| 5,326,726 | 7/1994 | Tsang et al. | 437/228 |
| 5,417,111 | 5/1995 | Sherman et al. | 73/514.36 X |
| 5,541,437 | 7/1996 | Watanabe et al. | 73/514.36 X |
| 5,572,057 | 11/1996 | Yamamoto et al. | 257/417 |
| 5,627,397 | 5/1997 | Kano et al. | 257/417 |

FOREIGN PATENT DOCUMENTS

| 0194953 | 4/1990 | European Pat. Off. . |
|---|---|---|
| 0671629 | 9/1995 | European Pat. Off. . |
| 61-212052 | 9/1986 | Japan . |

OTHER PUBLICATIONS

Nathanson et al., "The Resonant Gate Transistor," IEEE Transactions on Electron Devices, vol. ED–14, No. 3, Mar. 1967, pp. 117–133.

*Primary Examiner*—William Mintel
*Attorney, Agent, or Firm*—Kenneth M. Seddon; Daniel R. Collopy

[57] ABSTRACT

A semiconductor device (15) having a sensor (11) and a transistor (10) formed on a monolithic semiconductor substrate (16). The sensor (11) has a source region (41), a drain region (42), and a microstructure (12) which is formed from a conductive layer (28). The microstructure (12) modulates a channel region between the source and drain regions (41,42). The transistor has a gate structure, a portion of which is formed from the same conductive layer (28) used to form the microstructure (12). Anneal steps are performed on the conductive layer (28) to remove stress prior to the formation of source and drain regions (34,36) of the transistor (10). A self-test structure (14) is formed adjacent to the microstructure (12) which is used to calibrate and verify the operation of the sensor (11).

27 Claims, 5 Drawing Sheets

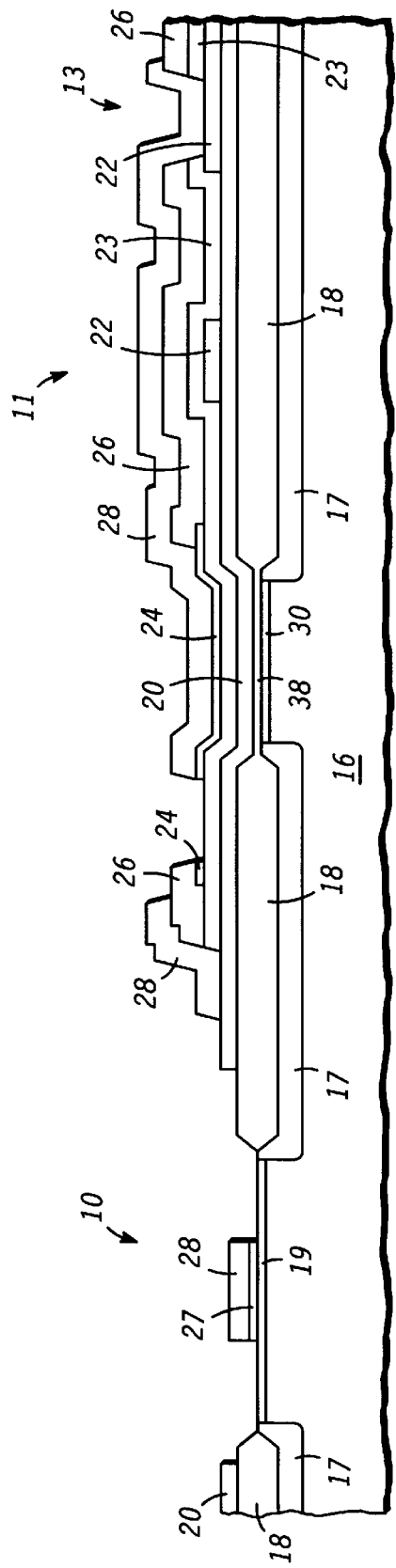
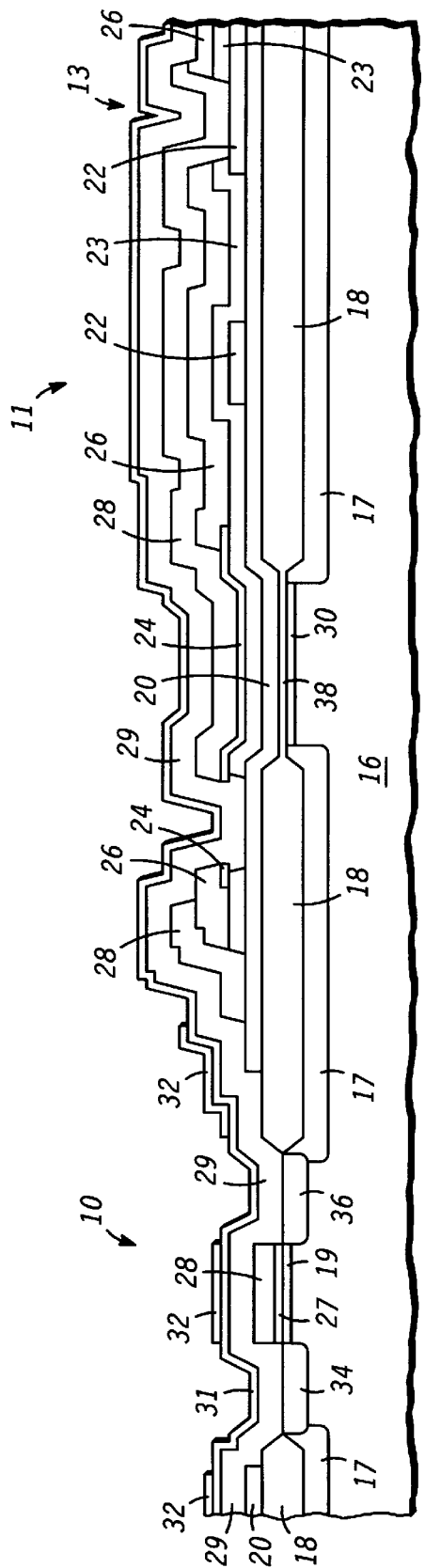

MONOLITHIC SEMICONDUCTOR DEVICE HAVING A MICROSTRUCTURE AND A TRANSISTOR

This application is a continuation of prior application Ser. No. 08/523,418, filed Sep. 5, 1995, now abandoned.

BACKGROUND OF THE INVENTION

The present invention relates, in general, to semiconductor devices, and more particularly, to semiconductor devices having a micromachined sensor and a transistor formed in a monolithic substrate.

Recently, applications for semiconductor devices have expanded into the area of sensing environmental conditions and processing that data accordingly. Typically information such as motion, pressure, or temperature is measured by a sensor device and then that value is manipulated by a neighboring logic circuit of transistors. The manufacturing of a sensor device, however, usually concludes with a massive etch step which is used to release a microstructure so it is free to move. This etch step can be destructive to neighboring transistors if they are not properly protected. Ideally the sensor structure and the transistor are in close proximity and would be manufactured together. Previously known methods for integrating sensor structures with transistors form each device separately and then combines the sensor and transistor with a wafer bonding and wire bonding process. Examples of forming semiconductor devices having a sensor and a transistor are shown in chapter 5 of "Sensor Technology and Devices" which was published by Artech House in 1994. Because the sensor and transistors are formed in separate process steps followed by a bonding process, the overall cost of this process is very expensive. In addition, wire bonding of two structures often induces noise into the sensing signal due to the interconnecting wires.

Attempts to form a sensor and transistor during one continuous process flow on a monolithic substrate are known in the art. These methods, however, typically form the transistor structure first and then attempt to protect the device with a thick etchant barrier while the sensor structure is formed. Although this does eliminate the need for wafer bonding steps to join the two structures, the lack of integration in the process flow exposes the transistor to performance degrading steps as the sensor is fabricated. High temperature processing during the formation of the sensor will drive the doped regions of the transistor further into the substrate. As a result, the annealing steps which are typically desired to reduce stress in the microstructure cannot be optimized.

Accordingly, it would be advantageous to have a method for forming a semiconductor device having a sensor and transistor that did not require a wafer bonding process to integrate the structures. It would be of further advantage to provide a method that could reduce the total number of process steps required to form the semiconductor device by forming portions of each structure simultaneously. It would be of even further advantage if the method were integrated such that performance of each structure could be optimized.

BRIEF DESCRIPTION OF THE DRAWINGS

FIGS. 6–9 are enlarged cross-sectional views of a semiconductor device according to the first embodiment of the present invention at various stages of fabrication.

DETAILED DESCRIPTION OF THE DRAWINGS

Figure 1:
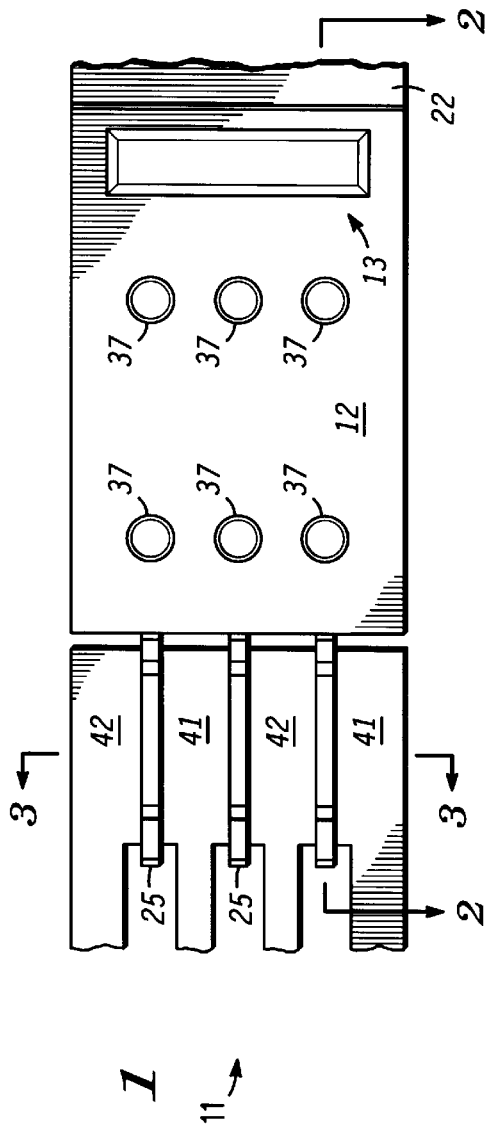
FIG. 1 is a top layout view of a sensor structure according to the present invention.
Figure 2:
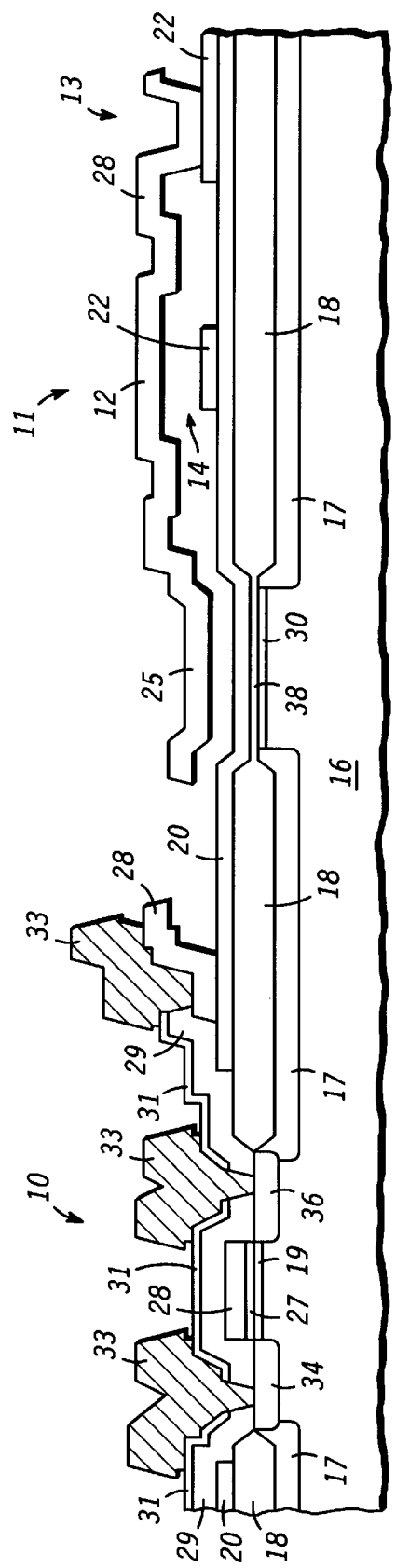
FIG. 2 is an enlarged cross-sectional view of a completed semiconductor device along the lines 2—2 of FIG. 1.

FIG. 1 is a top layout view of a sensor structure 11 formed in a semiconductor substrate 16 (see FIG. 2) according to the present invention and is provided to give an understanding of the operation of the sensing portion of a semiconductor device 15 (see FIG. 2). Acceleration, or de-acceleration, is sensed by microstructure 12 which is formed from a large mass of conductive material 28 (see FIG. 2). Microstructure 12 is hinged at anchoring region 13 and is free to move in a direction perpendicular to the plane formed by substrate 16. Anchoring region 13 is where conductive material 28, used to form microstructure 12, is attached to a polysilicon layer 22 which is formed overlying the semiconductor substrate 16.

The motion of microstructure 12 is detected by sensing transistors formed opposite to anchoring region 13. Fingers 25, which extend from the mass of microstructure 12, modulate channel regions which are formed between source regions 41 and drain regions 42. Movement in fingers 25 relative to the substrate will change the amount of current which flows between source region 41 and drain region 42. Movement of fingers 25 in the opposite direction will reduce the amount of current flow between source region 41 and drain region 42. Holes 37 are formed in microstructure 12 for two reasons. First holes 37 are used to adjust the total damping coefficient of microstructure 12, and secondly, holes 37 provide a pathway for etchant during the sacrificial etch of sensor structure 11 which will be described below.

FIG. 2 is an enlarged cross-sectional view of completed semiconductor device 15 along the lines 2—2 of FIG. 1. A process for manufacturing the monolithic semiconductor device 15 having a transistor 10 and a sensor 11 is described below. In the present invention transistor 10 is a Field Effect Transistor (FET) although it will be understood that transistor 10 could also be a Bi-polar Junction Transistor (BJT), a Insulated Gate Bi-polar Transistor (IGBT), a thyristor, or the like. Sensor structure 11 is formed such that the motion of microstructure 12 modulates a channel formed between source region 41 and drain region 42. It will also be understood that a capacitive structure comprising two conductive layers could also be formed and that sensor structure 11 is an accelerometer of the like.

For clarity, holes 37 shown in microstructure 12 of FIG. 1 were removed. It should also be noted that the layout shown in FIG. 1 only includes the elements of sensor structure 11 and does not include the elements of transistor 10. In a first embodiment, a self-test structure 14 is formed underlying microstructure 12 which is used to verify the operation of sensor structure 11. A voltage potential applied to self-test structure 14 will attract microstructure 12. The corresponding motion of microstructure 12 is then used to either calibrate sensor structure 11 or verify that sensor structure 11 is functional.

The present invention provides a method for forming sensor structure 11 and transistor 10 by forming portions of the two structures simultaneously. For instance, note that polysilicon layer 28 is used to form both microstructure 12 and a portion of a gate structure for transistor 10. Even though polysilicon layer 28 is deposited as a dielectric, the layer is doped to reduce the resistivity of the film and form a conductive layer. By forming sensor structure 11 and transistor 10 simultaneously, we can optimize annealing steps used to reduce stress in microstructure 12 and reduce the total number of process steps required to form semiconductor device 15.

Figure 3:
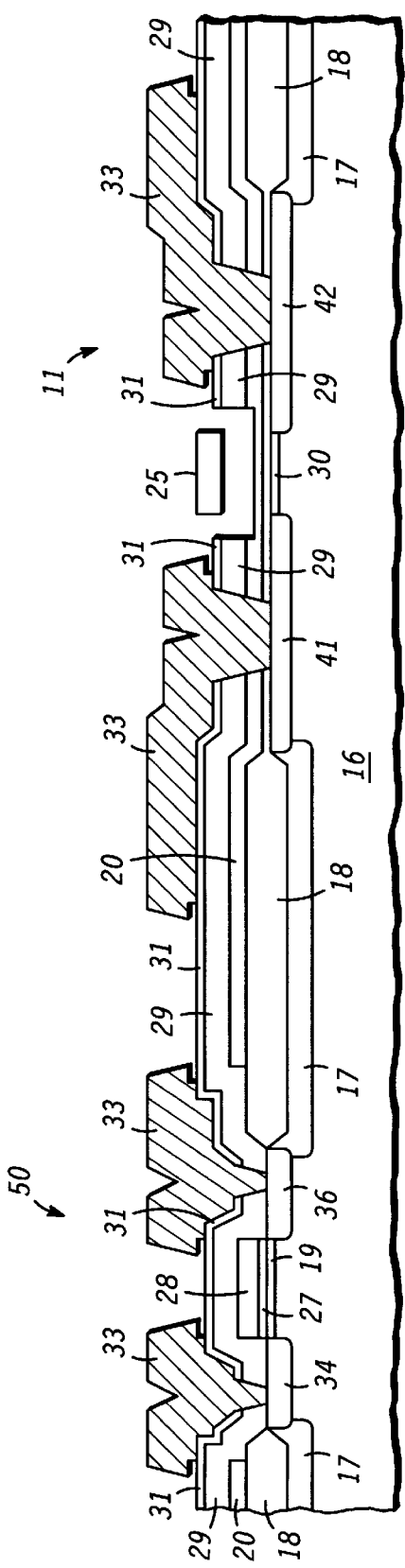
FIG. 3 is an enlarged cross-sectional view of a completed semiconductor device along the lines 3—3 of FIG. 1.

FIG. 3 is an enlarged cross-sectional view of completed semiconductor device 15 along the lines 3—3 of FIG. 1. Transistor 50 shown in FIG. 3 is a transistor not shown in FIG. 1 that resides near sensor 11 along the lines 3—3 of FIG. 1. Sensor 11 comprises a finger 25 which is used to modulate the channel region formed between source region 41 and drain region 42. A method for manufacturing monolithic semiconductor device 15 having a sensor 11 and a transistor 10 will now be provided. In the present invention, the FET 10 and sensor 11 formed are NMOS structures. However, it will be understood that PMOS structures could be formed by using wells, substrate, and dopants of the opposite conductivity. It will also be understood that sensor structure 11 could be a NMOS structure and that transistor 10 could be a PMOS structure or vice versa.

In the present invention several photoresist layers are used to pattern various underlying films. Typically each layer is formed from approximately 1 μm to 3 μm of photoresist which is spun on. Using a photo mask to pattern the layer, the photoresist layer is then exposed, developed, and baked to form a hard mask layer. To remove a patterned photoresist layer, a wet etch comprising peroxide and sulfuric acid is used.

The present invention also requires the deposition and etching of several films including silicon dioxide, silicon nitride, and polysilicon. A silicon dioxide film can be deposited in a Chemical Vapor Deposition (CVD) furnace at 800° C. to 1200° C., or in a Plasma Enhanced CVD (PECVD) system at 200° C. to 400° C. by combining Tetraethlyorthosilicate (TEOS) with an oxygen source. A silicon dioxide layer can also be grown from a silicon substrate in a furnace at 900° C. to 1100° C. with either a wet or dry source of oxygen. A silicon nitride layer can be formed either in a CVD reaction at 700° C. to 1000° C. or in a PECVD reaction at 200° C. to 400° C. by combining a silicon source such as dichlorosilane with ammonia. A polysilicon layer can be formed in a CVD reaction at 600° C. to 800° C. using the decomposition of silane. Silicon dioxide layers and polysilicon layers can be wet etched with a diluted solution of hydrofluoric acid. A silicon nitride layer can be wet etched with a solution of phosphoric acid. All three layers can be etched with a Reactive Ion Process (RIE) using a chlorine or fluorine ion source. Except when mentioned below, these techniques are examples which can be used to enable the present invention.

Figure 4:
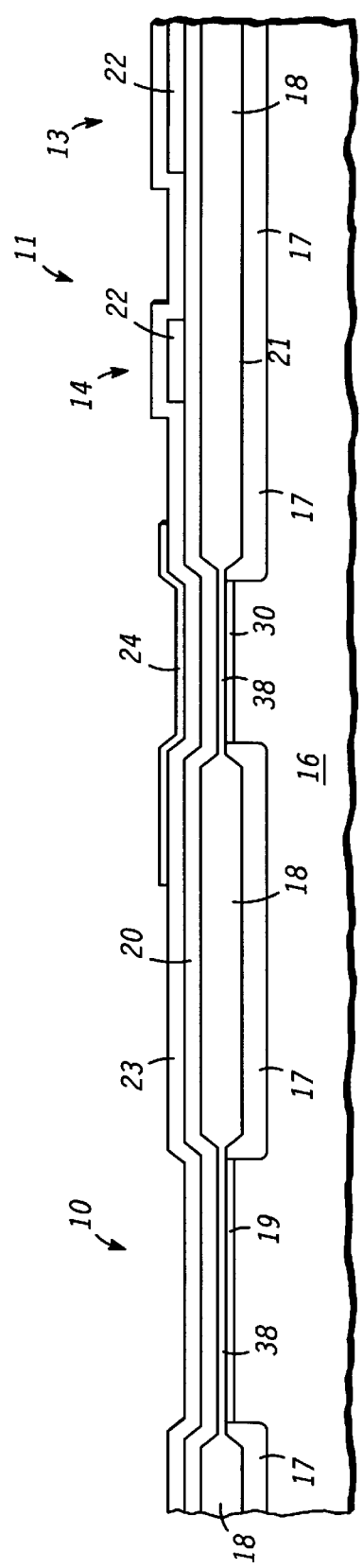
FIG. 4 is an enlarged cross-sectional view of a partially completed semiconductor device according to a first embodiment of the present invention.

FIG. 4 is an enlarged cross-sectional view of partially completed semiconductor device 15 according to the first embodiment of the present invention. This first embodiment forms self-test structure 14 using a polysilicon layer 22. Prior processing included forming field oxide regions 18 on semiconductor substrate or body of semiconductor material 16. A pad silicon dioxide layer, preferably 400 Å thick, and a silicon nitride layer, preferably 1400 Å thick, (not shown) are deposited and patterned with a first photoresist pattern overlying the silicon nitride layer. The exposed portions of the silicon nitride layer are removed with a RIE etch to expose portions of the underlying silicon dioxide layer. Field implant regions 17 are formed by implanting substrate 16 through the exposed portions of the silicon dioxide layer with a p-type dopant such as boron typically at a dose of 4E13 atoms/cm$^2$ at an energy of 25 Kev. The first photoresist layer is then removed.

Field oxide regions 18 are then formed by oxidizing the exposed surface of substrate 16 to a thickness of about 7500 Å. The pad silicon dioxide layer and silicon nitride layer are then removed with a sequence of wet etches to allow the formation of threshold adjust implant regions 19 and 30 for transistor 10 and sensor structure 11, respectively. Substrate 16 is first implanted with a p-type dopant such as boron with a dose of 1E12 and an energy of 80 Kev. A second photoresist pattern is formed to expose only the active area of sensor structure 11, and implanted with a n-type dopant such as arsenic with a typical dose of 1E12 atoms/cm$^2$ at an energy of 100 Kev. A silicon dioxide layer of approximately 400 Å may be grown on the exposed portions of substrate 16 prior to the implant steps to act as an implant screen. The silicon dioxide layer would then be removed with a wet etch following the formation of threshold adjust implant region 19 and 30.

After the second photoresist pattern is removed, a silicon dioxide layer 38, typically 400 Å thick, is formed by oxidizing the exposed active areas of transistor 10 and sensor structure 11. Silicon dioxide layer 38 can be formed in a CVD furnace with either a wet or dry oxidation in an ambient with a oxygen source at a temperature about 600° C. to 1200° C. A silicon nitride layer 20 with a preferred thickness of 1400 A is formed over silicon dioxide layer 38 in a CVD furnace at 700° C. to 800° C. Silicon nitride layer 20 is used to form a portion of the anchor region 13 for microstructure 12.

In the first embodiment of the present invention, self-test structure 14 is formed by depositing and patterning a layer of polysilicon 22 on silicon nitride layer 20 in the region where sensor 11 is formed. Polysilicon layer 22 can be deposited using the decomposition of silane in a CVD furnace at 600° C. to 850° C. and has a thickness of 1000 Å to 4000 Å. Polysilicon layer 22 is either in-situ doped or doped after deposition with a phosphine source to have a resistivity of 5 Ohms/sq to 10,000 Ohms/sq. A third photoresist pattern is used to define which portions of polysilicon layer 22 are removed with a subsequent RIE etch. The remaining portions of polysilicon layer 22 form self-test structure 14. The third photoresist pattern is then removed.

A silicon dioxide layer 23, with a preferred thickness of 1500 Å, is then formed on silicon nitride layer 20 and the remaining portions of polysilicon layer 22. Silicon dioxide layer 23 can be deposited in either a CVD furnace using silane at 950° to 1150° C. or a PECVD reactor at 200° C. to 400° C. During deposition, silicon dioxide layer 23 is doped with a phosphorus source, such as trimethlyphosphite or phosphine, to a phosphorus concentration of 3% to 9%. The etch rate and conformality of silicon dioxide layer 23 is controlled by the concentration of dopant in the film. A third silicon nitride layer 24 is then formed on silicon dioxide layer 23 with a preferred thickness of 400 Å. Silicon nitride layer 24 is then patterned with a fourth photoresist layer and etched using a RIE etch process such that a portion of silicon nitride layer 24 remains over the active area of sensor structure 11. The fourth photoresist layer is then removed.

Figure 5:
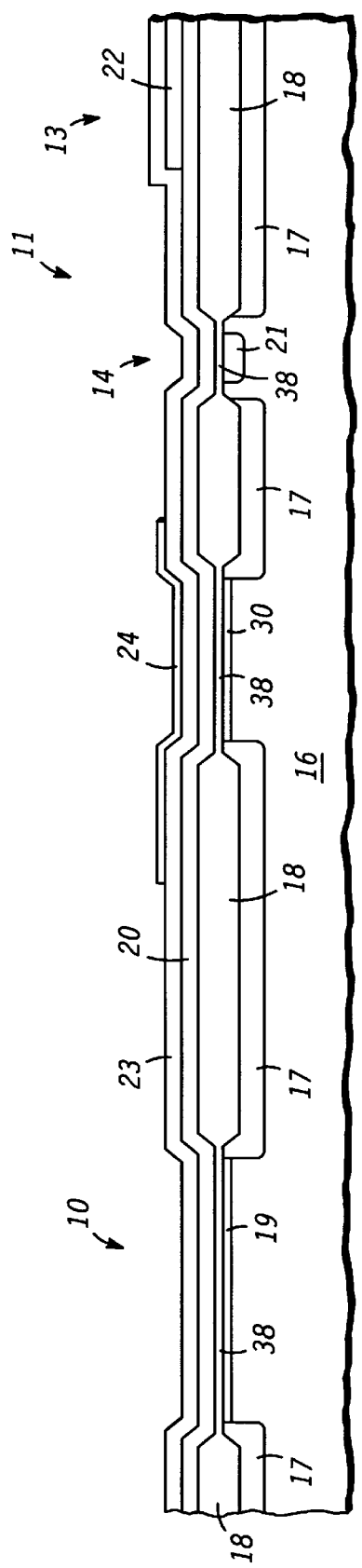
FIG. 5 is an enlarged cross-sectional view of a partially completed semiconductor device according to a second embodiment of the present invention.

FIG. 5 is an enlarged cross-sectional view of a partially completed semiconductor device 15 according to a second embodiment of the present invention. In the second embodiment, self-test structure 14 is formed with a doped region 21 in semiconductor substrate 16. After the formation of threshold adjust implant regions 19 and 30, a fifth photoresist pattern is formed on substrate 16 to expose only the area of self-test structure 14. A dopant such as arsenic is implanted into substrate 16 with a dose of 7E15 atoms/cm$^2$ and energy of 80 Kev is used to form doped region 21. It is also possible to form doped region 21 prior to the formation of threshold adjust implant regions 19 and 30 or use the dopant during the formation of threshold adjust implant regions 19 and 30 to partially or completely form doped region 21. After forming doped region 21, the fifth photoresist layer is removed.

Figure 6:
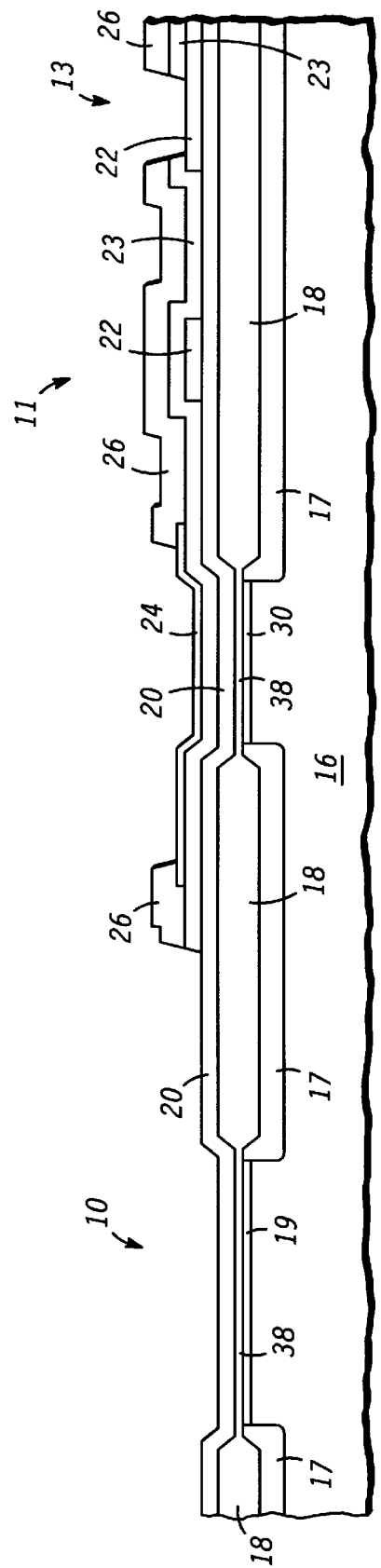

FIG. 6 is an enlarged cross-sectional view of semiconductor device 15 according to the first embodiment of the present invention after further processing. A silicon dioxide layer 26, with a preferred thickness of 10,000 Å, is then formed on silicon nitride layer 24 and silicon dioxide layer 23. Silicon dioxide layer 26 can be deposited in either a CVD furnace using silane at 950° to 1150° C. or a PECVD reactor at 200° C. to 400° C. During deposition, silicon dioxide layer 23 is doped with a phosphorus source, such as trimethlyphosphite or phosphine, to a phosphorus concentration of 3% to 9%. The etch rate and conformality of silicon dioxide layer 26 is controlled by the concentration of dopant in the film.

Following deposition, silicon dioxide layer 26 and the underlying silicon dioxide layer 23 are densified to remove pin holes in the films and improve the subsequent etch rate control of the films. Densification is an annealing process where the films are heated to 900° C. to 1000° C. for 30 minutes to 2 hours. Silicon dioxide layer 26 is then selectively patterned with a sixth photoresist layer and the portions of silicon dioxide layer 26 and 23 that are over anchor region 13 and the entire active region of transistor 10 are removed. The portions of silicon dioxide layer 26 over silicon nitride layer 24 are also removed. Silicon dioxide layers 23 and 26 are removed with a wet etch solution comprising hydrofluoric acid. The sixth photoresist layer is then removed.

FIG. 7 is an enlarged cross-sectional view of semiconductor device 15 according to the first embodiment of the present invention after further processing. A seventh photoresist layer is used to expose only the portions of silicon nitride layer 20 overlying substrate 16 in the region where transistor 10 is formed. Using a RIE etch, the exposed portions of silicon nitride layer 20 are removed to expose the underlying portions of silicon dioxide layer 38. Silicon dioxide layer 38 is then removed using a wet etch comprising hydrofluoric acid to expose a portion of substrate 16 where transistor 10 will be formed. The seventh photoresist layer is then removed to allow further processing.

A sacrificial oxide (not shown) is grown and removed on the exposed portions of substrate 16 to remove any impurities from the gate region of transistor 10. Then gate oxide layer 27, preferably 400 Å thick, is grown on substrate 16 using a dry oxidation process in an oxygen ambient at 800° C. to 1200° C. in a CVD furnace. A gate polysilicon layer 28 which is 5,000 Å to 10,000 Å in thickness is deposited on gate oxide layer 27. Note that since there is no exposed surfaces of silicon in the region wherein sensor structure 11 is formed, gate oxide layer 27 is confined to the active region of transistor 10. Gate polysilicon layer 28 is formed over all surfaces of substrate 16 including the exposed portion of anchor region 13. Therefore, gate polysilicon layer 28 not only forms a portion of the gate structure for transistor 10, but also forms a portion of sensor 11. The thickness of gate polysilicon layer 28 can be adjusted to optimize the final mass of microstructure 12 and the performance of transistor 10. Either during or following the deposition, gate polysilicon layer 28 is doped with a phosphorous source such as phosphine to reduce the resistivity of gate polysilicon layer 28 to 5 Ohms/sq to 10,000 Ohms/sq. This will reduce the stress in microstructure 12 and reduce the resistance of interconnect lines made from gate polysilicon layer 28.

A third silicon dioxide layer (not shown), with a preferred thickness of 10,000 Å, is then formed on all surfaces of substrate 16. The third silicon dioxide layer can be deposited in either a CVD furnace using silane at 950° to 1150° C. or a PECVD reactor at 200° C. to 400° C. During deposition, the third silicon dioxide layer is doped with a phosphorus source, such as trimethylphosphite or phosphine, to a phosphorus concentration of 3% to 9%. The etch rate and conformality of the third silicon dioxide layer is controlled by the concentration of dopant in the film. The thickness and doping concentration of the third silicon dioxide layer should be comparable to that of silicon dioxide layer 26 which is formed below gate polysilicon layer 28. This will minimize the amount of stress variation from the bottom to the top of polysilicon layer 28, due to any difference in thickness and prevent stress due to concentration gradients of dopants in gate polysilicon layer 28.

A blanket photoresist layer of 1 μm to 3 μm in thickness is formed over all portions of semiconductor device 15. A RIE etch is then used to remove any and all deposited layers from the backside of substrate 16 which were formed by the previous process steps. The removal of these layers is necessary to get an accurate measurement of the temperature of substrate 16 to enhance the performance of thermal anneal steps to follow. The blanket photoresist is then removed from the front side of substrate prior to the anneal steps. The first anneal is performed in a furnace with an inert ambient such as argon. Substrate 16 is heated to 900° C. to 1150° C. for 1 hour to 4 hours. A second anneal is a Rapid Thermal Anneal (RTA) which heats substrate 16 to 900° C. to 1150° C. for 15 seconds to 75 seconds. The combination of these anneals reduces the stress in gate polysilicon layer 28. This will improve the predictability of the performance of sensor 11 and prevent microstructure 12 from warping during subsequent process steps.

The third silicon dioxide layer is then removed with a wet etch containing hydrofluoric acid to expose the underlying gate polysilicon layer 28. An eighth photoresist layer and subsequent RIE etch is used to define gate polysilicon layer 28 such that portions of gate polysilicon layer 28 remain to form microstructure 12, a portion of the gate structure for transistor 10, and protect transistor 10 from etch steps to follow to release microstructure 12. A subsequent RIE etch is performed to remove any exposed portions of silicon nitride layer 24. The eighth photoresist layer is then removed to allow further processing FIG. 8 is an enlarged cross-sectional view of semiconductor device 15 according to the first embodiment of the present invention after further processing. A wet etch employing hydrofluoric acid is performed to remove any oxides that may have formed on the surface of substrate 16 where source region 34 and drain region 36 will be formed. Preferably 200 Å of silicon dioxide is grown with a dry oxidation in an oxygen ambient at 800° C. to 1200° C. in a furnace. For the purpose of clarity and to keep the elements of the figures relatively proportional to each other, the 200 Å of silicon dioxide is not shown. It will be incorporated into the layers of silicon dioxide which are formed in the steps to follow.

Source and drain regions 34 and 36 are formed by implanting substrate 16 through a ninth patterned photoresist mask. An n-type dopant such as arsenic is implanted into substrate 16 with a dose of 7E15 atoms/cm$^2$ and an energy of 80 Kev. The ninth photoresist layer is then removed and a tenth photoresist layer is formed to define a source region 41 and a drain region 42 for sensor structure 11. Substrate 16 is then implanted through the openings in tenth photoresist layer with a n-type dopant such as phosphorus with a dose of 5E15 atoms/cm$^2$ with an energy of 150 Kev. After the tenth photoresist layer is removed, substrate 16 is annealed to activate the dopants used to form source and drain regions 34,36,41, and 42. The anneal is typically performed at 900° C. for about 30 minutes. Note that since anneals to remove stress from microstructure 12 were performed prior to the formation of source and drain regions 34, 36, 41, and 42, the depth and profile of these regions can be optimized. In an alternate embodiment, an eleventh photoresist pattern may be used to form ohmic contact regions to substrate 16 which are implanted with boron with a dose of 3E15 atom/cm$^2$ and an energy of 35 Kev.

A silicon dioxide layer 29, with a preferred thickness of 7,000 Å, is then formed on gate polysilicon layer 28. Silicon dioxide layer 29 can be deposited in either a CVD furnace using silane at 950° to 1150° C. or a PECVD reactor at 200° C. to 400° C. During deposition, silicon dioxide layer 29 is doped with a phosphorus source, such as trimethlyphosphite or phosphine, to a phosphorus concentration of 3% to 9%. The etch rate and conformality of silicon dioxide layer 29 is controlled by the concentration of dopant in the film. Following deposition, silicon dioxide layer 29 is annealed in a CVD furnace for about 20–30 minutes at approximately 900° C. to allow silicon dioxide layer 29 to reflow and form a planar surface over substrate 16.

A silicon nitride layer 31, with a preferred thickness of 1400 Å, and a silicon dioxide layer 32, with a preferred thickness of 2,000 Å, are then deposited on silicon dioxide layer 29. Silicon nitride layer 31 is used as an etch mask layer to protect structures and materials underlying silicon nitride layer 31 during a final etch step to release microstructure 12 as described below. Silicon dioxide layer 29 acts as an etchant barrier during the formation of metalized regions 33 to source and drain regions 34, 36, 41, and 42. A twelfth photoresist pattern followed by a wet etch comprising hydrofluoric acid is used to remove silicon dioxide layer 32 where metalized regions 33 will be formed. The twelfth photoresist layer is removed to allow further processing.

Figure 9:
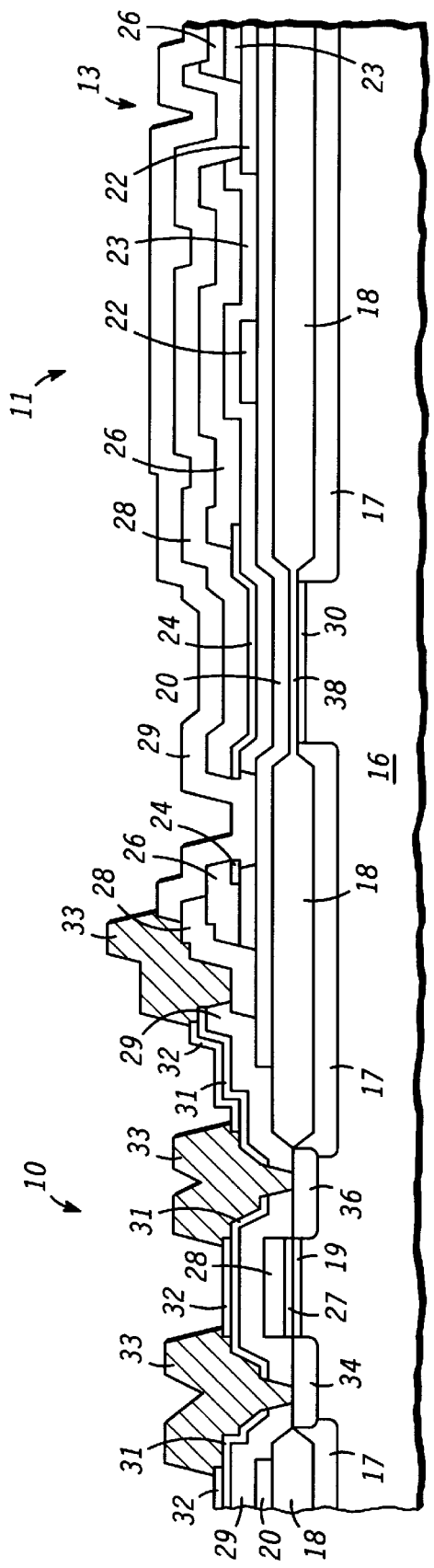

FIG. 9 is an enlarged cross-sectional view of semiconductor device 15 according to the first embodiment of the present invention after further processing. A thirteenth photoresist layer is formed to pattern silicon nitride layer 31. A RIE etch is used to remove the portions of silicon nitride layer 31 and silicon dioxide layer 29 to expose portions of source and drain regions 34, 36, 41, and 42. The thirteenth photoresist layer is removed and a fourteenth photoresist layer is formed to expose the portions of silicon nitride layer 31 in the region where sensor structure 10 is formed. An RIE etch is then performed to remove the exposed portions of silicon nitride layer 31 and expose the underlying portions of silicon dioxide layer 29. The fourteenth photoresist layer is removed to allow further processing.

A metal layer of aluminum silicon, with a preferred thickness of 20,000 Å, is deposited over all front side surfaces of substrate 16. The aluminum silicon layer is patterned to form contact regions 33 by patterning the aluminum silicon layer with a fifteenth photoresist mask and using a RIE etch to remove the exposed portions of the aluminum silicon layer. To aide in the adhesion of the fifteenth photoresist layer to the metal layer during the etching process, a silicon dioxide layer (not shown) of about 1,000 Å may be deposited on the metal layer prior to forming the fifteenth photoresist layer. Since a metal layer is already overlying substrate 16, the silicon dioxide layer used for adhesion for the fifteenth photoresist layer should be formed with a low temperature PECVD process.

After contact regions 33 have been formed, the fifteenth photoresist and silicon dioxide layer are removed. To remove hydrogen and water that may have been incorporated into semiconductor device 15 during the previous processing steps, semiconductor device 15 is annealed in a forming gas ambient typically at 390° C. for 30 minutes. To release microstructure 12 and form semiconductor device 15 as shown in FIG. 2 and FIG. 3, the remaining portions of silicon dioxide layers 29, 26, and 23 are removed with a wet etch comprising hydrofluoric acid. Holes 37 (shown in FIG. 1) allow etchant to quickly remove all of the silicon dioxide remaining under microstructure 12. Depending on the selectivity of the etchant used, the final thickness of metal contact regions 33 may be approximately 10,000 Å after the etch process.

By now it should be appreciated that the present invention provides a method for forming a semiconductor device having a sensor 11 and a transistor 10. During processing, a polysilicon layer 28 is formed which acts as part of the gate structure for transistor 10 and microstructure 12 for sensor 11. Prior to the formation of source and drain regions 34, 36, 41, and 42, all deposited material is removed from the backside of substrate 16. This improves the control of subsequent anneal steps which are used to remove stress in microstructure 12. Since the anneal steps are performed prior to the formation of source and drain regions 34, 36, 41, and 42, the depth and profile of these regions can be optimized. By forming portion of sensor 11 and transistor 10 simultaneously, the total number of process steps to form semiconductor device 15 is reduced and the need for a wafer bonding process is obviated.

We claim:

1. A monolithic semiconductor device having a sensor and a transistor comprising:

a semiconductor substrate;

the sensor having a source region, a drain region and a channel region in the semiconductor substrate, and a microstructure, wherein the microstructure comprises a conductive layer overlying the semiconductor substrate, and the microstructure is electrically coupled solely to regions in the semiconductor substrate underlying the microstructure as the microstructure moves in response to acceleration; and the transistor having a gate structure, wherein the conductive layer used to form the microstructure is also used to form at least a portion of the gate structure, and the conductive layer used to form the microstructure comprises a same material used to form at least a portion of the gate structure.

2. The monolithic semiconductor device having a sensor and a transistor of claim 1, wherein the transistor formed is selected from the group consisting of field effect transistor, and insulated gate bi-polar transistor.

3. The monolithic semiconductor device having a sensor and a transistor of claim 1, wherein the conductive layer is formed from a layer of polysilicon.

4. The monolithic semiconductor device having a sensor and a transistor of claim 3, wherein the layer of polysilicon is doped to a resistivity of 5 ohms/sq to 10,000 ohms/sq.

5. The monolithic semiconductor device having a sensor and a transistor of claim 1, further comprising a self-test structure underlying the microstructure.

6. The monolithic semiconductor device having a sensor and a transistor of claim 5, wherein the self-test structure comprises a conductive layer.

7. The monolithic semiconductor device having a sensor and a transistor of claim 5, wherein the self-test structure comprises a doped region in the semiconductor substrate.

8. A semiconductor device comprising:
   a substrate;
   a source region, a channel region, and a drain region in the substrate, wherein the source region, the channel region, and the drain region are provided by dopant of the same conductivity type;
   a sensor formed in a first region of the semiconductor device, wherein the sensor has a moveable microstructure comprising a conductive layer that has a first portion higher than a second portion, the moveable microstructure modulates the channel region; and
   a field effect transistor formed in a second region, wherein the field effect transistor has a gate structure.

9. The semiconductor device of claim 8, wherein the gate structure comprises the conductive layer used to form the moveable microstructure.

10. The semiconductor device of claim 8, wherein the conductive layer is formed from a layer of polysilicon.

11. The semiconductor device of claim 10, wherein the layer of polysilicon is doped to a resistivity of 5 ohms/sq to 10,000 ohms/sq.

12. The semiconductor device of claim 8, wherein the sensor is an accelerometer.

13. The semiconductor device of claim 8, further comprising a self-test structure adjacent to the moveable microstructure.

14. A sensor comprising:
   a self-test structure overlying a semiconductor substrate used to verify operation of the sensor;
   a source region and drain region in the semiconductor substrate; and
   a microstructure formed overlying the self-test structure such that when a voltage potential is placed on the self-test structure, the microstructure moves, the self-test structure being between the semiconductor substrate and the microstructure.

15. The sensor of claim 14, wherein the self-test structure comprises a conductive layer.

16. The sensor of claim 14, wherein the self-test structure comprises a doped region in the semiconductor substrate.

17. A semiconductor device comprising:
   a semiconductor substrate;
   a sensor having a source region and drain region in the semiconductor substrate, and a microstructure overlying the semiconductor substrate, wherein the microstructure comprises a conductive layer;
   a transistor having a gate structure, wherein the conductive layer used to form the microstructure is also used to form at least a portion of the gate structure; and
   a self-test structure between the semiconductor substrate and the microstructure such that when a voltage potential is placed on the self-test structure, the microstructure moves.

18. The semiconductor device of claim 17, wherein the conductive layer is formed from a layer of polysilicon.

19. The semiconductor device of claim 18, wherein the layer of polysilicon is doped to a resistivity of 5 ohms/sq to 10,000 ohms/sq.

20. The semiconductor device of claim 17, wherein the sensor is an accelerometer.

21. The semiconductor device of claim 17, wherein the self-test structure comprises a conductive layer.

22. The semiconductor device of claim 17, wherein the self-test structure comprises a doped region in the semiconductor substrate.

23. A semiconductor device comprising:
   a semiconductor substrate;
   a sensor having a source region, a drain region, and a channel region in the semiconductor substrate that are of the same conductivity type; and
   a microstructure comprising a conductive layer overlying the semiconductor substrate, wherein the microstructure is electrically coupled solely to the source region, the drain region, and the channel region as the microstructure moves in response to acceleration; and
   a transistor having a gate structure, wherein the conductive layer used to form the microstructure is also used to form at least a portion of the gate structure, and the conductive layer used to form the microstructure comprises a same material used to form at least a portion of the gate structure.

24. The semiconductor device of claim 23 wherein the microstructure comprises a first portion and a second portion, the second portion being lower than the first portion.

25. The semiconductor device of claim 24 wherein the second portion of the microstructure is overlying the channel region, and the first portion of the microstructure is at least 9600 Å higher than the second portion of the microstructure.

26. The semiconductor device of claim 23 wherein a current flow across the channel region is decreased when a first voltage potential is placed between the microstructure and the channel region, a second voltage potential is placed between the source region and the drain region, and the microstructure is moved towards the channel region.

27. The semiconductor device of claim 8 wherein the moveable microstructure is electrically coupled only to structures underlying the moveable microstructure.

* * * * *

UNITED STATES PATENT AND TRADEMARK OFFICE
CERTIFICATE OF CORRECTION

PATENT NO.     : 5,808,331
DATED          : September 15, 1998
INVENTOR(S)    : Lisa Zhang, Barun Kar, Gary Li, Ronald Gutteridge and Eric Joseph It is certified that error appears in the above-identified patent and that said Letters Patent is hereby corrected as shown below:

Column 8,
Line 41, delete "the" and replace with -- a --.
Line 49, delete "the" and replace with -- a --.
Line 57, delete "field effect" and replace with -- bi-polar junction --.
Line 58, delete "and insulated gate bi-polar transistor." and replace with -- field effect transistor, insulated gate field bi-polar transistor, and thyristor. --.

Signed and Sealed this

Thirtieth Day of July, 2002

Attest:

JAMES E. ROGAN
Attesting Officer      Director of the United States Patent and Trademark Office